(12) United States Patent
Yoshida et al.

(10) Patent No.: US 10,648,886 B2
(45) Date of Patent: May 12, 2020

(54) IN-VEHICLE ELECTRONIC CONTROL UNIT

(71) Applicant: DENSO CORPORATION, Kariya, Aichi-pref. (JP)

(72) Inventors: Tomofumi Yoshida, Kariya (JP); Yoshiyasu Futamura, Kariya (JP); Shinya Noda, Kariya (JP)

(73) Assignee: DENSO CORPORATION, Kariya (JP)

( * ) Notice: Subject to any disclaimer, the term of this patent is extended or adjusted under 35 U.S.C. 154(b) by 135 days.

(21) Appl. No.: 15/903,441

(22) Filed: Feb. 23, 2018

(65) Prior Publication Data

US 2018/0372587 A1  Dec. 27, 2018

(30) Foreign Application Priority Data

Jun. 21, 2017 (JP) ................................. 2017-121359

(51) Int. Cl.
| | |
|---|---|
| *G01R 31/00* | (2006.01) |
| *G01M 15/08* | (2006.01) |
| *H03M 1/46* | (2006.01) |
| *G01R 19/25* | (2006.01) |
| *H03M 1/12* | (2006.01) |

(52) U.S. Cl.
CPC ......... *G01M 15/08* (2013.01); *G01R 19/2509* (2013.01); *G01R 31/007* (2013.01); *H03M 1/462* (2013.01); *H03M 1/1215* (2013.01)

(58) Field of Classification Search
CPC ...... G01M 15/08; G01R 31/007; H03M 1/462
See application file for complete search history.

(56) References Cited

U.S. PATENT DOCUMENTS

| | | | | |
|---|---|---|---|---|
| 6,757,897 | B1* | 6/2004 | Shi ........................ | G06F 9/4843 710/240 |
| 2006/0107926 | A1* | 5/2006 | Endou ................... | F02D 35/027 123/435 |
| 2008/0010563 | A1* | 1/2008 | Nishimura ............ | G06F 9/4812 714/55 |
| 2008/0228374 | A1* | 9/2008 | Ishizuka ............. | F02D 41/3809 701/103 |
| 2009/0063016 | A1* | 3/2009 | Nakata ................ | F02D 41/2096 701/103 |
| 2012/0197416 | A1* | 8/2012 | Taira ........................ | G05B 9/02 700/14 |
| 2013/0220006 | A1* | 8/2013 | Ito ....................... | F02D 41/0025 73/114.51 |
| 2013/0304352 | A1* | 11/2013 | Macfarlane ........... | F02D 41/221 701/102 |
| 2014/0014208 | A1* | 1/2014 | Ishikawa ................ | F16H 61/12 137/628 |

\* cited by examiner

*Primary Examiner* — Thang X Le
*Assistant Examiner* — Alvaro E Fortich
(74) *Attorney, Agent, or Firm* — Posz Law Group, PLC

(57) ABSTRACT

In adjustment processing executed at the same period as waveform analysis processing, a CPU of a microcomputer permits an execution of the waveform analysis processing on condition that the waveform analysis processing has been completed. Thus a period of non-execution of the waveform analysis processing is ensured between a completion of preceding waveform analysis processing to an execution of next waveform analysis processing. Since low priority processing, which has been disabled to be executed, is enabled to be executed, it is possible to stop continuation of disablement of execution of the low priority processing.

16 Claims, 8 Drawing Sheets

IN-VEHICLE ELECTRONIC CONTROL UNIT

CROSS REFERENCE TO RELATED APPLICATION

The present application is based on Japanese patent application No. 2017421359 filed on Jun. 21, 2017, the whole contents of which are incorporated herein by reference.

FIELD

The present disclosure relates to an in-vehicle electronic control unit.

In conventional diesel engine control disclosed in JP 2008-144749A (US 2008/0228374A1), for example, an injector is provided with a pressure sensor, which detects a pressure of fuel, and an injection rate is detected by waveform analysis processing based on a variation of fuel pressure detected by the pressure sensor for calculation of a correction value to be used for correcting an operation characteristic, for example, a fuel injection characteristic. In more detail, a sensor output signal is analog-to-digital (AD) converted at every short period (for example, 10 μs), the injection rate is calculated based on the pressure variation by using AD conversion data at every fixed specified period and the correction value is calculated based on the calculated injection rate.

For the waveform analysis, the waveform analysis processing is executed on the AD conversion data of the specified period each time the specified period ends. In case that the waveform analysis processing of the AD conversion data of a preceding specified period is still under execution at time of ending of a present specified period, the waveform analysis processing, which is to be executed next, is delayed. In this case, the next waveform analysis processing is executed in succession following a completion of the preceding waveform analysis processing.

In case that the waveform analysis processing is delayed repeatedly, the waveform analysis processing is executed in succession. This results in a vast number of calculations. It is thus likely that an execution of low priority processing, a priority of which is lower than that of the waveform analysis processing, is delayed (task delay) or disabled (task disablement). Further, in case that a task is monitored by a software processing execution monitoring function, it is also likely that the internal combustion engine control is not performed properly upon detection of an abnormality in a task execution.

SUMMARY

It is therefore an object to provide an in-vehicle electronic control unit, which enables execution of low priority processing, a priority of which is lower than a waveform analysis processing for an internal combustion engine condition analysis.

According to one aspect, an in-vehicle electronic control unit comprises an acquisition part, a waveform analysis processing part, an adjustment processing part and a control part. The acquisition part acquires a state data indicating a predetermined state variation of each cylinder of an internal combustion engine at every specified period. The waveform analysis processing part executes waveform analysis processing, which determines an operation characteristic of the each cylinder of the internal combustion engine, based on the state data of the specified period, in case that an execution of the waveform analysis processing is permitted. The adjustment processing part permits the execution of the waveform analysis processing on condition that the waveform analysis processing has been completed. The control part delays the execution of the waveform analysis processing in case that high priority processing, a priority of which is higher than that of the waveform analysis processing, is under execution at time of an activation of the waveform analysis processing, delays an activation of low priority processing, a priority of which is lower than that of the waveform analysis processing, in case that the waveform analysis processing is under execution at an activation time of the low priority processing, and activates the adjustment processing part in correspondence to the activation of the waveform analysis processing.

DETAILED DESCRIPTION OF THE EMBODIMENT (First Embodiment)

Figure 1:
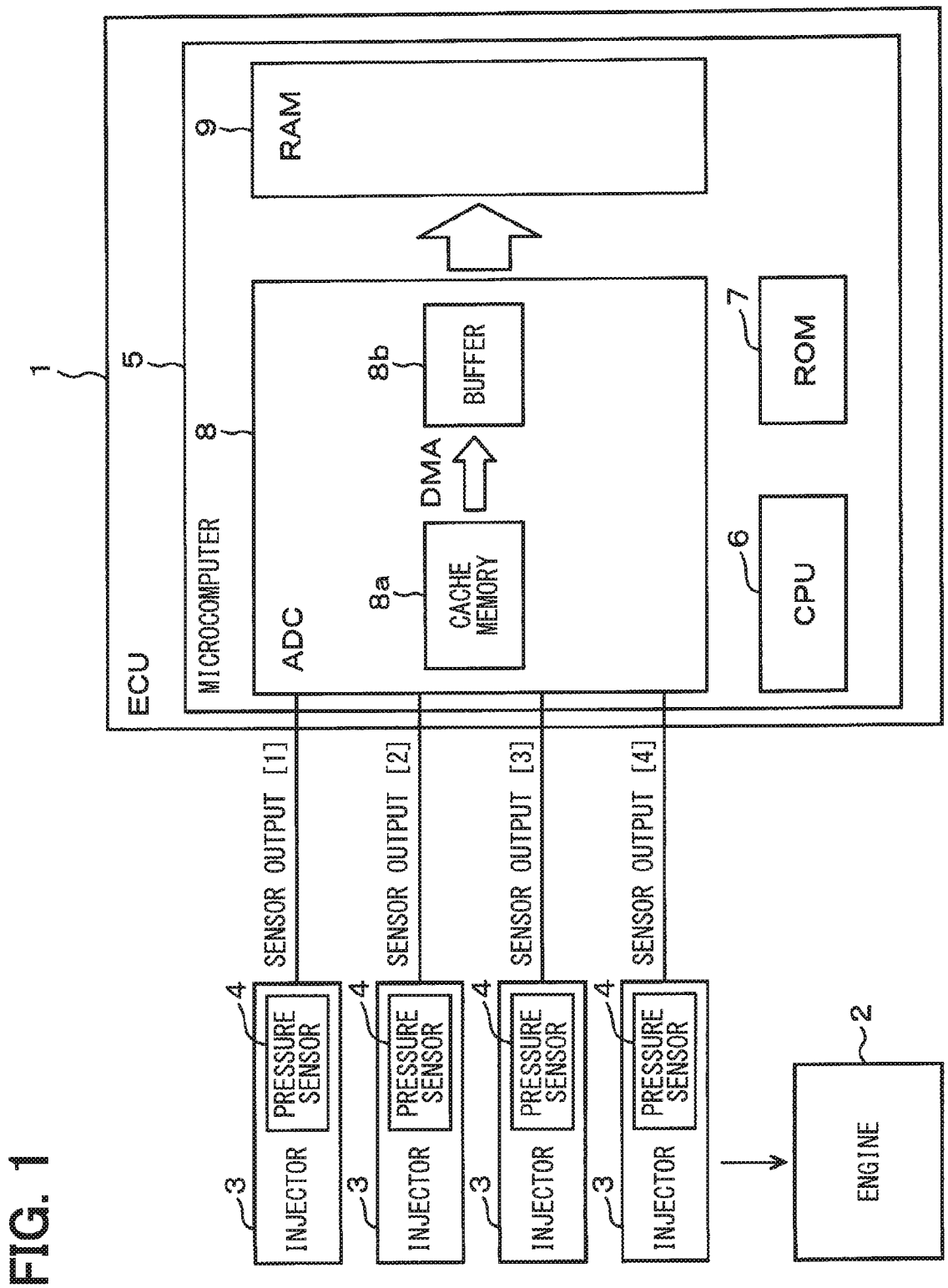
FIG. 1 is a block diagram showing a whole configuration of an in-vehicle electronic control unit in a first embodiment.

A first embodiment will be described with reference to FIG. 1 to FIG. 4. Referring first to FIG. 1, an electronic control unit 1 is provided as an in-vehicle electronic control unit (hereinafter referred to as ECU) for controlling an internal combustion engine 2 mounted in a vehicle. The engine 2 is, for example, a four-cylinder diesel engine. In the following description, individual devices and outputs, which correspond to four cylinders #1 to #4 of the engine 2, are identified with [1] to [4] attached to each reference numeral, respectively.

Injectors 3 are mounted on the cylinders #1 to #4 for injecting fuel into the cylinders #1 to #4, respectively. Fuel is supplied to each injector 3 from a common rail (not shown), which accumulates high-pressure fuel supplied from a fuel pump (not shown). In the injector 3, a pressure sensor 4 is provided at a fuel inlet port, to which fuel is supplied from the common rail, for example, for detecting a fuel pressure. The pressure sensor 4 outputs a sensor signal, which varies a voltage level (hereinafter referred to as sensor output). The sensor output varies between 0 to 5 volts (V), for example, in proportion to a detected fuel pressure.

The ECU 1 includes a microcomputer (hereinafter referred to as computer) 5 as a main component to control the engine 2 by execution of a variety of processing, which include control for the injector 3 of each cylinder.

The computer 5 is formed of a CPU 6, a ROM 7, an ADC (analog-to-digital converter) 8 and a RAM 9. The CPU 6 executes various programs to operate as a control part, a waveform analysis processing part and an adjustment processing part. The ROM 7 stores processing programs, which are to be executed by the CPU 6. The ADC 8 is an acquisition part, which converts analog sensor outputs [1] to [4] of the pressure sensors 4[1] to 4[4] to digital values (AD conversion data) at every predetermined period (10 µs, for example). The RAM 9 stores the AD conversion data (state data) the ADC, and arithmetic calculation results of the CPU 6.

The ADC 8 includes a cache memory 8a for storing the AD conversion data resulting from each AD conversion of the sensor outputs [1] to [4] in each specified period SP at a high speed. Each specified period is a fixed time interval (4 ms, for example) and exemplarily indicated sequentially as SP-A, SP-B, SP-C and the like in FIG. 2. The ADC 8 further has a DMA function for transferring the AD conversion data stored in the cache memory 8a into a buffer 8b in succession.

The CPU 6 detects a fuel injection characteristic as an operation characteristic by acquiring the AD conversion data stored in the buffer 8b of the ADC 8 into the RAM 9 and executing waveform analysis processing on the AD conversion data of each specified period SR The CPU 6 then uses the detection result of the fuel injection characteristic in fuel injection control of the injector 3.

The detection result of the waveform analysis processing is used in the fuel injection control as follows. The waveform analysis processing is executed in correspondence to each cylinder of the engine 2 in a predetermined sequential order, which corresponds to the order of combustions, that is, firing order among four cylinders. In case that the combustion arises in the order of cylinders #1, #3, #4 and #2, the waveform analysis processing is executed in this sequential firing order. Since the engine 2 has four cylinders, combustion strokes of the cylinders #1, #3, #4 and #2 are assumed to correspond to a first detection period (0° to 180° CA), a second detection period (180° to 360° CA), a third detection period (360° to 540° CA) and a fourth detection period (540° to 720° CA), respectively. Each detection period is an angular period, which corresponds to an angular interval of 180° (one-half rotation) of a crankshaft rotation angle (CA).

Thus, in the first detection period, the waveform analysis processing is executed based on the AD conversion data corresponding to the cylinder #1. In the second detection period, the waveform analysis processing is executed based on the AD conversion data corresponding to the cylinder #3. In the third detection period, the waveform analysis processing is executed based on the AD conversion data corresponding to the cylinder #4. In the fourth detection period, the waveform analysis processing is executed based on the AD conversion data corresponding to the cylinder #2.

Figure 2:
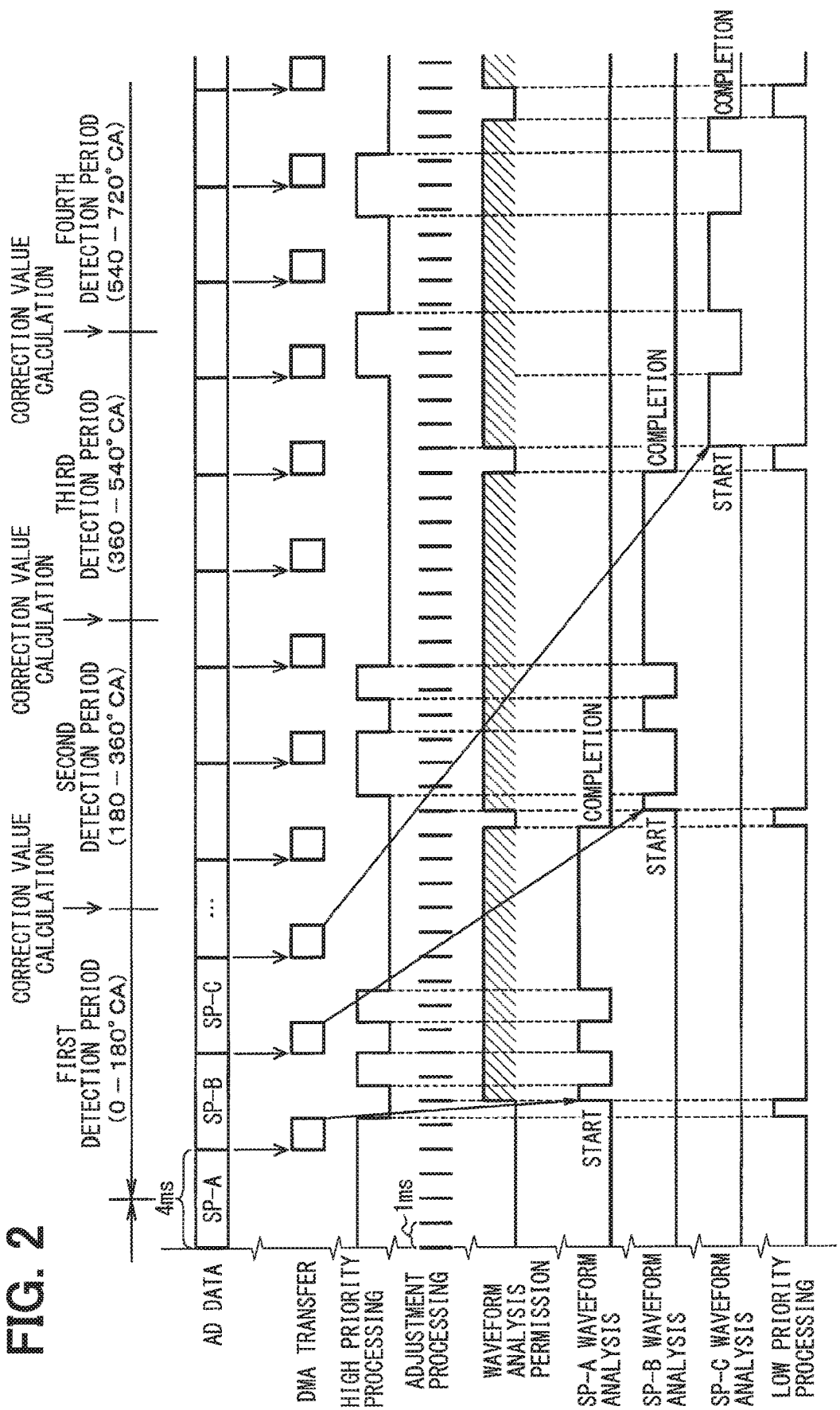
FIG. 2 is a time chart showing each processing executed in the first embodiment.

As shown in FIG. 2, the waveform analysis processing is executed in sequence in correspondence to the specified period SP-A, the specified period SP-B, the specified period SP-C and subsequent specified periods. When each detection period ends, all of the waveform analysis processing of plural specified periods SP corresponding to the detection period are executed in an integrated manner.

The CPU 6 of the computer 5 executes the waveform analysis processing and the like in the following manner. In the following description, the waveform analysis processing is assumed to start from the first detection period. The CPU 6 activates the waveform analysis processing shown in FIG. 3 at every period of 1 ms, for example. After activating the waveform analysis processing, the CPU 6 checks whether the execution of the waveform analysis processing (waveform analysis processing execution) is permitted (S101). In case that it is permitted (S101: YES), the CPU 6 stores data (S102). In this data storing, the CPU 6 transfers the AD conversion data of the specified period SP-A stored in the buffer 8b of the ADC 8 to the RAM 9 and stores therein (refer to FIG. 1).

The CPU 6 then executes the waveform analysis processing (S103). This waveform analysis processing is for detecting the fuel injection characteristic based on the AD conversion data of the specified period SP-A stored in the RAM 9. To be in detail, the CPU 6 detects a pressure variation state such as fuel pressure leak and fluctuation characteristics caused by fuel injection from the injector 3[1] by executing the waveform analysis processing such as filtering processing, differentiation processing and the like on the AD conversion data.

The CPU 6 then checks whether all data in the specified period, for example, 400 AD conversion data (4 ms/10 µs), have been processed (S104). In case that at least some data have not been processed yet (S104: NO), the CPU 6 repeats the waveform analysis processing (S103) described above. In case that all data in the specified period have been processed (S104: YES), the CPU 6 finishes the waveform analysis processing after setting that the waveform analysis processing execution has been completed. The CPU 6 sets the execution of the waveform analysis processing to be inhibited (not permitted), in case of setting that the waveform analysis processing execution has been completed. As a result, the CPU 6 is not permitted to execute the next waveform analysis processing until the next execution of the waveform analysis processing is permitted.

The CPU 6 activates adjustment processing (refer to FIG. 2), which adjusts timing of execution of the waveform analysis processing, at every period of 1 ms, for example. That is, the CPU 6 activates the adjustment processing at the same period as that of the waveform analysis processing. In this case, although the adjustment processing is activated at the same time as the waveform analysis processing, the adjustment processing is executed first with higher priority over the waveform analysis processing.

Figure 4:
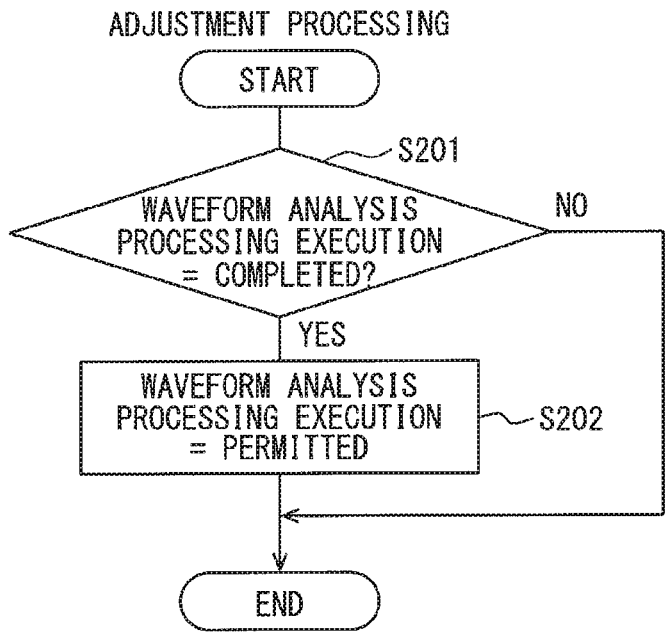
FIG. 4 is a flowchart showing adjustment processing executed in the first embodiment.

After activating the adjustment processing, the CPU 6 checks as shown in FIG. 4 whether the waveform analysis processing execution has been completed (S201). In case that the waveform analysis processing is still under execution at the activation time of the adjustment processing, that is, the waveform analysis processing has not been completed yet (S201: NO), the CPU 6 does not execute the adjustment processing.

In case that the waveform analysis processing execution is completed at the next activation time of the adjustment processing (S201: YES), the CPU 6 permits the execution of the waveform analysis processing (S202). Since the CPU 6 executes the adjustment processing with the higher priority over the waveform analysis processing, the CPU 6 executes the waveform analysis processing, which has been activated at the same time as the adjustment processing, after the execution of the adjustment processing.

According to the operation described above, the period of non-execution of the waveform analysis processing between the completion of the preceding waveform analysis processing and the execution of the next waveform analysis processing (refer to FIG. 2), the CPU 6 is enabled to execute the low priority processing during the non-execution of the waveform analysis processing.

After the first detection period (0° to 180° CA), the CPU 6 calculates a correction value, which indicates the fuel injection characteristic of the injector 3[1], by integrating the plural waveform analysis processing executed in the first detection period. That is, the CPU 6 detects the fuel injection characteristic of the injector 3[1] based on the pressure variation state in the first detection period. The fuel injection characteristic includes, for example, an injection start delay period, which is from fuel injection start command time to actual fuel injection start time, and an injection stop delay period, which is from fuel injection stop command time to actual fuel injection stop time. The CPU 6 detects the injection characteristic as the correction value for correcting driving start time and driving period of the injector 3[1] and executes the fuel injection control in the next first detection period by using such a correction value.

Figure 3:
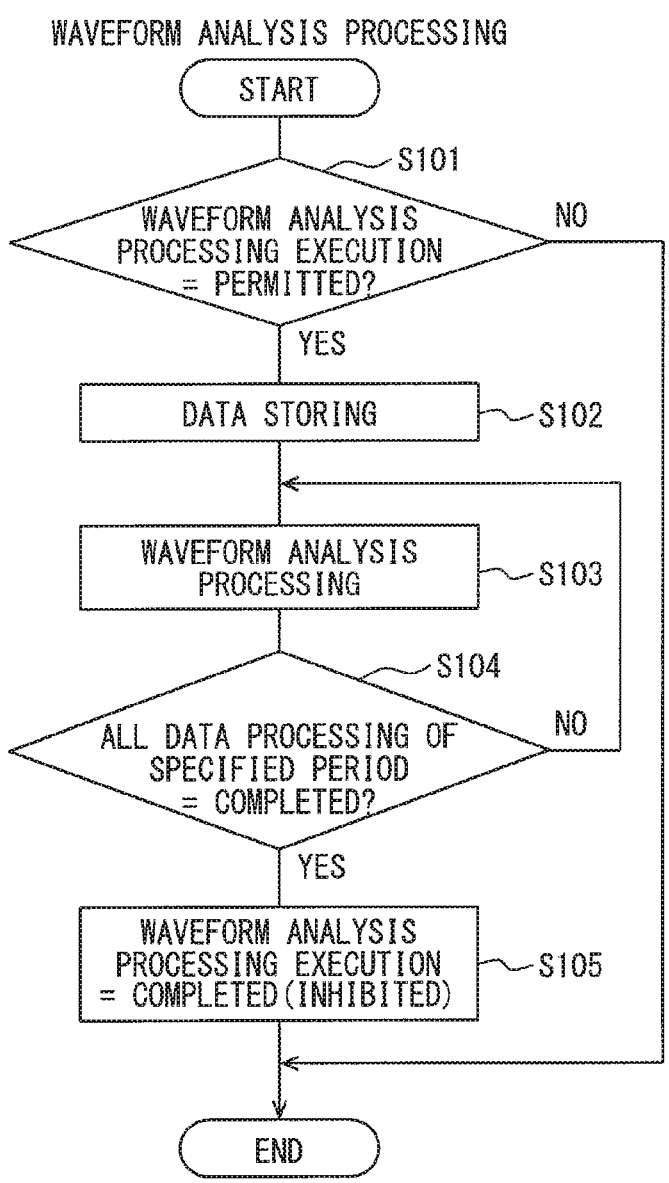
FIG. 3 is a flowchart showing waveform analysis processing executed in the first embodiment.

Although not shown in FIG. 3, when the first detection period ends, the CPU 6 switches over an execution-permitted cylinder, which is to be permitted as an object for the waveform analysis processing, to a next cylinder for advancing its processing to the next detection period.

That is, when the first detection period ends, the CPU 6 advances its processing to the second detection period (180° to 360° CA) by switching over the execution-permitted cylinder to the third cylinder #3. Then, when the second detection period ends, the CPU 6 calculates the correction value, which indicates the fuel injection characteristic of the injector 3[3], by integrating the plural waveform analysis processing executed in the plural specified periods SP corresponding to the second detection period.

Similarly, when the second detection period ends, the CPU 6 advances its processing to the fourth detection period (360° to 540° CA) by switching over the execution-permitted cylinder to the fourth cylinder #4. Then, when the third detection period ends, the CPU 6 calculates the correction value, which indicates the fuel injection characteristic of the injector 3[4], by integrating the plural waveform analysis processing executed in the plural specified periods corresponding to the third detection period.

Further, when the third detection period ends, the CPU 6 advances its processing to the fourth detection period (540° to 720° CA) by switching over the execution-permitted cylinder to the second cylinder #2. Then, when the fourth detection period ends, the CPU 6 calculates the correction value, which indicates the fuel injection characteristic of the injector 3[2], by integrating the plural waveform analysis processing executed in the plural specified periods corresponding to the fourth detection period. When the fourth detection period ends, the CPU 6 advances its processing to the first detection period by switching over the execution-permitted cylinder to the first cylinder #1 again. The CPU 6 repeats the processing as described above.

The first embodiment provides the following advantages. In the adjustment processing executed at the same period as the waveform analysis processing, the CPU 6 of the computer 5 permits the execution of the waveform analysis processing on condition that the waveform analysis processing has been completed. Thus the period of non-execution of the waveform analysis processing is ensured between the completion of the preceding waveform analysis processing to the execution of the next waveform analysis processing. Since low priority processing, which has been inhibited from execution, is permitted to be executed, it is possible to stop continuation of disablement of the execution of the low priority processing.

In case that task monitoring is executed by software processing execution monitoring function, it is possible to reduce probability that the internal combustion engine control is adversely affected as a result of detection as a task abnormality.

Although the adjustment processing is set to have a higher priority than that of the waveform analysis processing, the adjustment processing may be set to have a lower priority than that of the waveform analysis processing. In case that the priority of the adjustment processing is set to be lower than that of the waveform analysis processing, the next waveform analysis processing is not executed. In this case, it is possible to extend a period between the completion of the preceding waveform analysis processing and the next waveform analysis processing, that is, a period for executing the low priority processing.

Second Embodiment

A second embodiment will be described with reference to FIG. 5. The same processing steps in the second embodiment (and also third and subsequent embodiments) as in the preceding embodiment are designated with the same reference numerals thereby to simplify the description.

In the second embodiment, the CPU 6 does not execute the next waveform analysis processing when a period of disablement of the low priority processing becomes long. The CPU 6 executes the waveform analysis processing similarly to the first embodiment.

Figure 5:
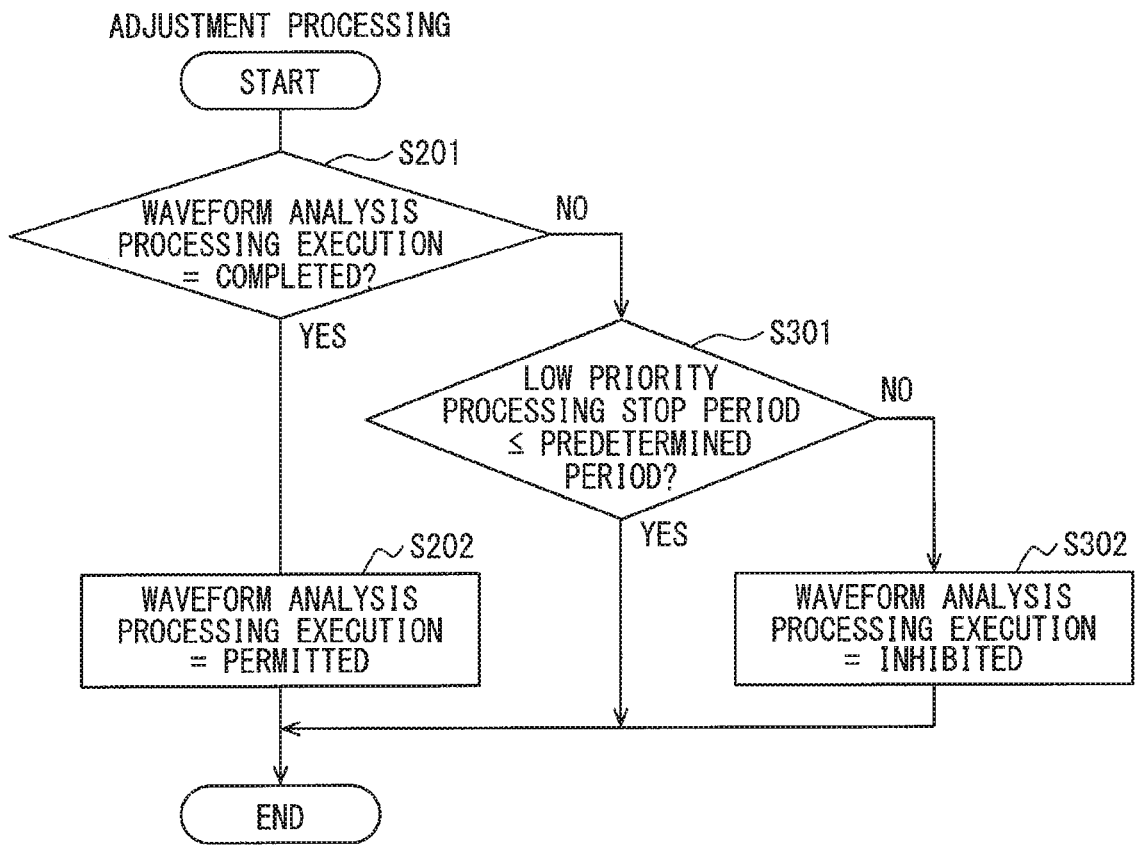
FIG. 5 is a flowchart showing adjustment processing executed in a second embodiment.

In the adjustment processing shown in FIG. 5, in case that the waveform analysis processing execution has not been completed yet (S201: NO), the CPU 6 checks whether a low priority processing stop period, during which the execution of the low priority processing has been disabled, is less than a predetermined period (S301). The predetermined period is set not to cause any adversary result in the engine control as a result of continued disablement of the low priority processing. In case that the execution of the low priority processing is disabled for more than the predetermined period (S301: NO), the CPU 6 sets the waveform analysis processing execution to be inhibited (not permitted) (S302) and finishes the adjustment processing.

According to the operation described above, since the waveform analysis processing is inhibited, the next waveform analysis processing is not executed, In case that the execution of the waveform analysis processing execution has been completed in the preceding waveform analysis processing execution (S201: YES), the CPU 6 permits the waveform analysis processing (S202) and executes the next waveform analysis processing.

According to the second embodiment described above, when the low priority processing is disabled for more than the predetermined period, the CPU 6 does not execute the next waveform analysis processing. As a result, the non-execution period, which is for stopping the execution of the waveform analysis processing, is provided between the completion of the preceding waveform analysis processing and the start of the next waveform analysis processing. Thus the low priority processing, which has been disabled by the waveform analysis processing, is enabled to be executed. It is possible to enable the execution of the low priority processing without being disabled continuously.

Figure 9:
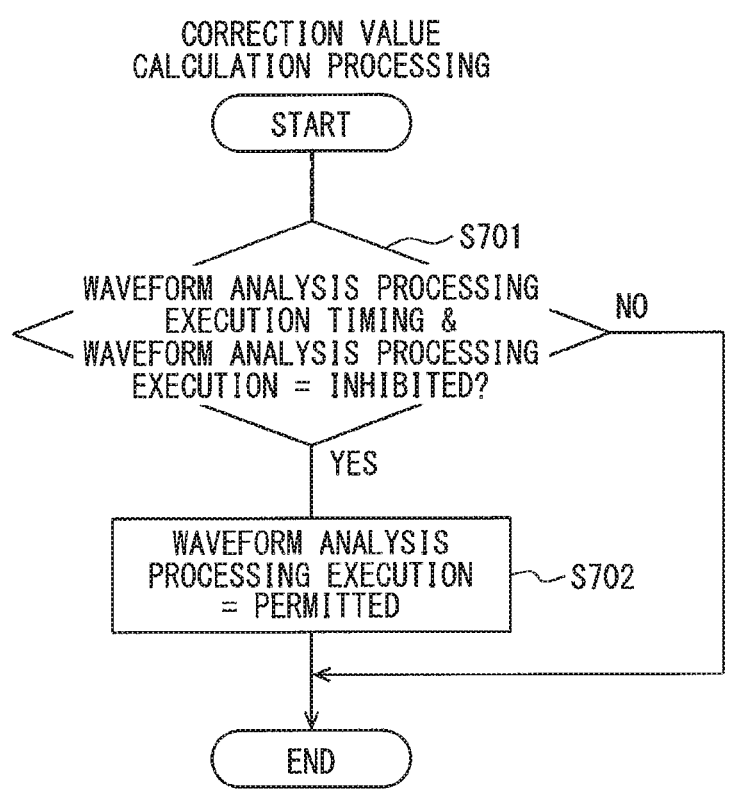
FIG. 9 is a flowchart showing correction value calculation processing executed in the second and third embodiments.

Although the CPU 6 inhibits the next waveform analysis processing, the CPU 6 resumes the waveform analysis processing later as exemplified in FIG. 9. That is, in correction value calculation processing for calculating the correction value of fuel injection characteristic of the injector 3, the CPU 6 checks at step S701 before the correction value calculation (not shown) whether the waveform analysis processing execution is inhibited although it is time to execute the waveform analysis processing. In case that the check result is YES indicating the inhibition state, the CPU 6 permits the waveform analysis processing at step S702. According to this setting of permission at step S702, the CPU 6 executes immediately the waveform analysis processing for the present cylinder. For example, in case that the present cylinder for the next waveform analysis processing is the cylinder #1, the CPU 6 executes the waveform analysis processing from the cylinder #2, inhibiting the waveform analysis processing for the cylinder #3 and cylinder #4.

Third Embodiment

A third embodiment will be described with reference to FIG. 6. In the third embodiment, the CPU 6 interrupts the execution of the waveform analysis processing, which is under execution, when the period of disablement of the low priority processing becomes long. That is, the CPU 6 suspends the execution of the waveform analysis processing. The CPU 6 executes the adjustment processing similarly to the second embodiment.

Figure 6:
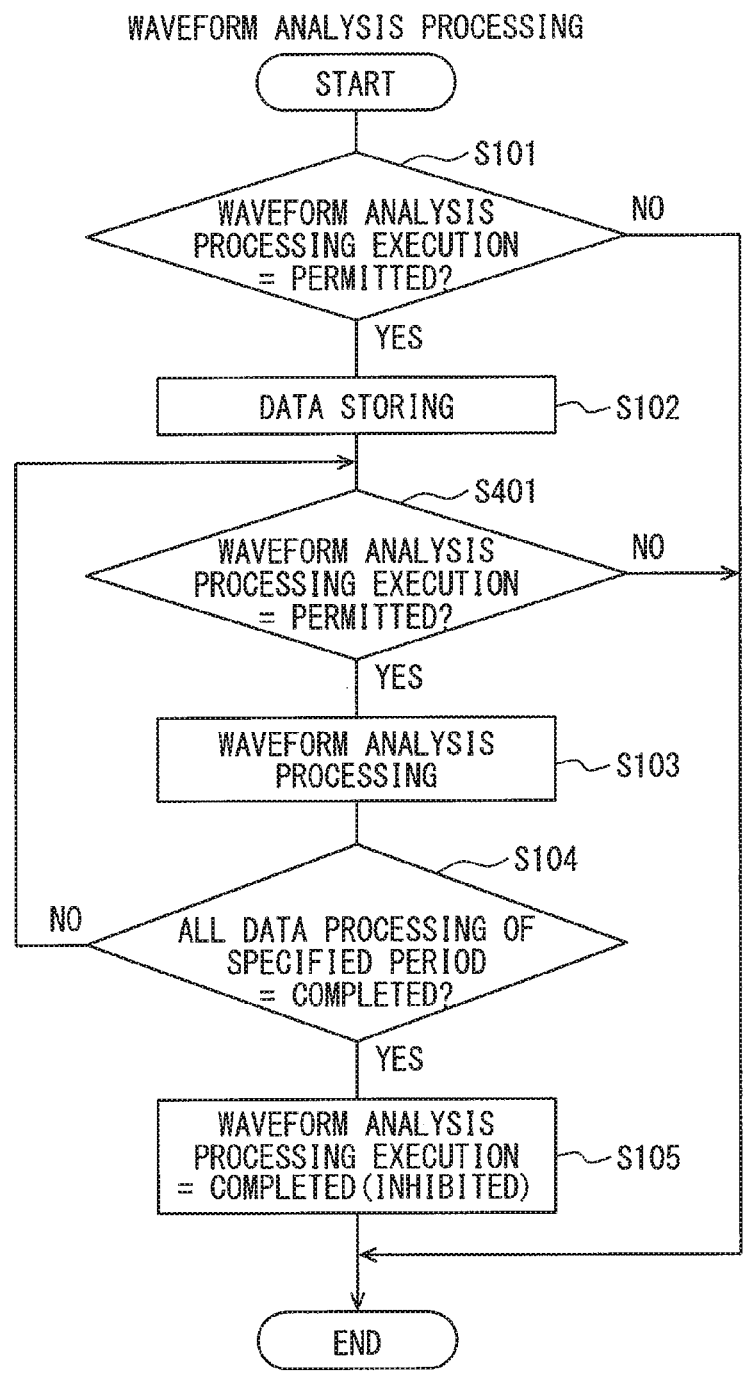
FIG. 6 is a flowchart showing waveform analysis processing executed in a third embodiment.

In waveform analysis processing shown in FIG. 6, when at least a part of all data processing in the specified period has not been completed yet (S104: NO), the CPU 6 checks whether the waveform analysis processing execution is permitted (S401) and executes the waveform analysis processing (S103). In case that, because of a disablement period of the low priority processing exceeding a predetermined period, the waveform analysis processing execution is not permitted (S401: NO), the CPU 6 interrupts the waveform analysis processing execution and finishes the waveform analysis processing.

According to the third embodiment, when the disablement period of the low priority processing exceeds the predetermined period, the CPU 6 interrupts the waveform analysis processing. As a result, the non-execution period for stopping the execution of the waveform analysis processing between the completion of the preceding waveform analysis processing and the start of the next waveform analysis processing, that is, a period permitted to execute the low priority processing is extended. Thus the low priority processing, which has been disabled by the waveform analysis processing, is enabled to be executed. It is possible to enable the execution of the low priority processing at earlier time without being disabled continuously.

Although the CPU 6 interrupts the waveform analysis processing, the CPU 6 resumes the waveform analysis processing later in a generally similar manner as described in the second embodiment with reference to FIG. 9.

Fourth Embodiment

A fourth embodiment will be described with reference to FIG. 7. In the fourth embodiment, the CPU 6 delays time of permitting the execution of the waveform analysis processing by the adjustment processing, when the low priority processing is stopped frequently. The CPU 6 executes the waveform analysis processing similarly to the first embodiment.

Figure 7:
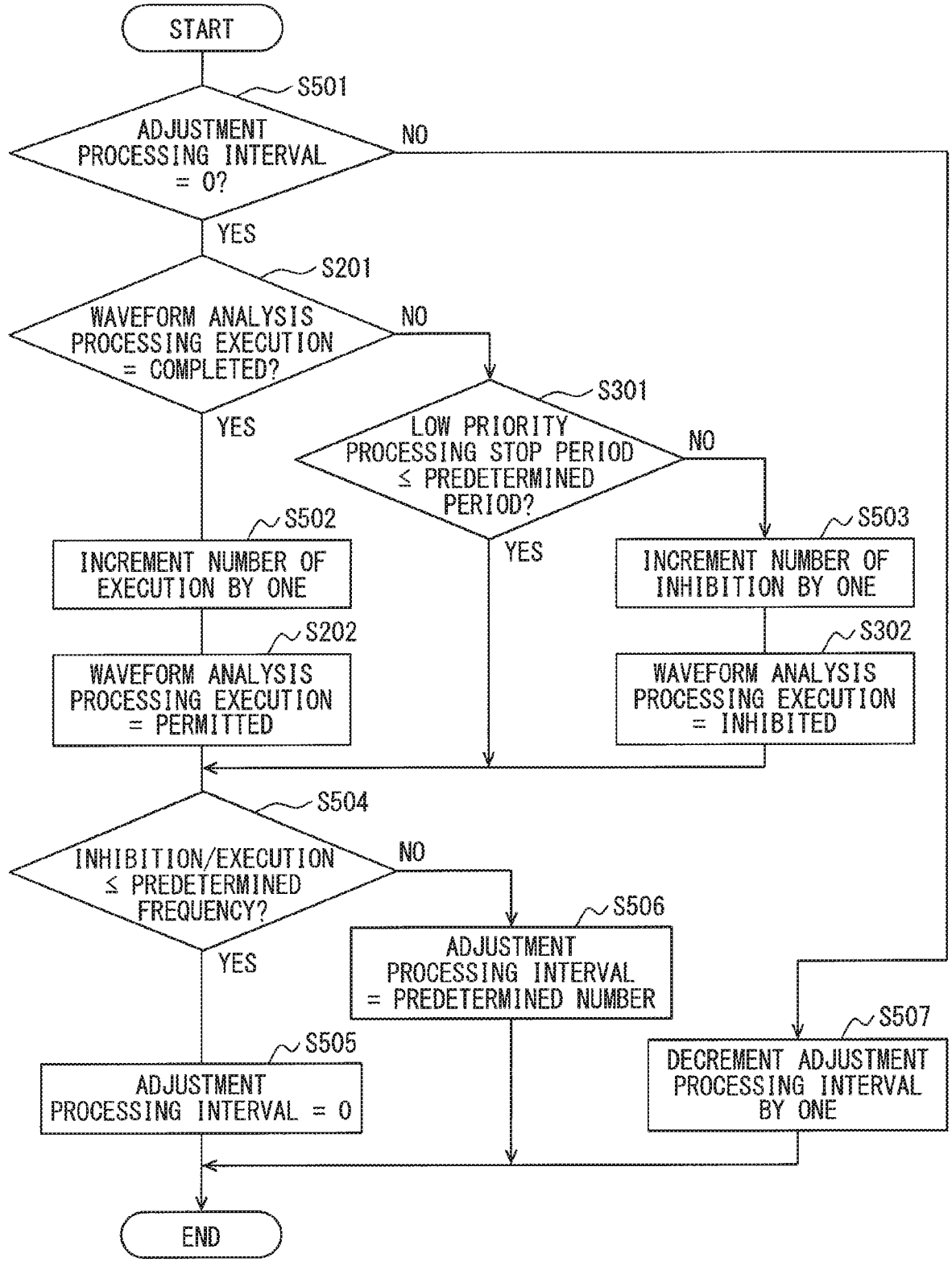
FIG. 7 is a flowchart showing adjustment processing executed in a fourth embodiment.

In the adjustment processing shown in FIG. 7, the CPU 6 checks whether an adjustment processing interval, which is an interval between two successive adjustment processing, is 0 (S501). This adjustment processing interval corresponds to the number of the adjustment processing, which does not execute any substantive processing. The adjustment processing interval is set to 0 initially. That is, the number of executions of the adjustment processing, which do not execute any substantive processing, is 0. This state indicates that the adjustment processing is executed at every 1 ms period similarly to the embodiment described above. When the waveform analysis processing execution has been completed (S201: YES) under a state that the adjustment processing interval is 0, the CPU 6 increments the number of executions by one by adding 1 to a previous execution value (S502).

Until the waveform analysis execution is completed (S201: NO), the CPU 6 checks whether the stop period of the low priority processing is less than the predetermined period (S301). In case that the stop period of the low priority processing exceeds the predetermined period (S301: NO), the CPU 6 increments the number of inhibition of the waveform analysis processing execution by one by adding 1 to a previous inhibition value (S503)

In case of adding 1 to the previous execution value or adding 1 to the previous inhibition value, the CPU 6 calculates, as an inhibition frequency, the number of inhibitions (non-permission) of the waveform analysis processing relative to the number of adjustment processing executions, that is, number of normally completed waveform analysis (S201: YES). The CPU 6 then checks whether the inhibition frequency is smaller than a predetermined frequency, for example 0.5 (S504). For example, when the number of inhibitions of the waveform analysis processing is 5 and 6 relative to the number of completions of the waveform analysis processing is 10, the inhibition frequencies are 0.5 and 0.6, respectively. In case that the inhibition frequency is smaller than the predetermined frequency (S504: YES), the CPU 6 determines that the low priority processing will not be affected adversely and sets the adjustment processing interval to 0 (S505). That is, the adjustment processing interval is maintained to be 0.

Under a state that the adjustment processing interval is 0 (S501: YES), it is possible to provide a period of non-execution of the waveform analysis processing between the completion of the preceding waveform analysis processing and the execution of the next waveform analysis processing similarly to the first embodiment.

However, in case that the non-permission frequency increases, it is likely that the low priority processing is adversely affected. For this reason, in case that the inhibition frequency exceeds the predetermined frequency (S504: NO), the CPU 6 sets the adjustment processing interval to a predetermined number (S506).

In case that the adjustment processing interval is set to the predetermined number, the adjustment processing interval becomes different from 0 (S501: NO). The CPU 6 decrements the adjustment processing interval by subtracting 1 from the adjustment processing interval (predetermined number) and finishes the adjustment processing. That is, the CPU 6 finishes the adjustment processing without substantially executing anything.

In case that the adjustment processing interval is not 0 (S501: NO), the CPU 6 executes in repetition the adjustment processing without any substantive processing and subtracts 1 from the previous adjustment processing interval each time. In case that the adjustment processing interval is decremented to 0 as a result of repetition of the predetermined number of the adjustment processing described above (S501: YES), the CPU 6 permits the execution of the waveform analysis processing (S202). Thus the next waveform analysis processing is executed.

According to the fourth embodiment, when the inhibition frequency exceeds the predetermined frequency, the CPU 6 activates the adjustment processing, in which no substantive processing is executed, the predetermined number of times. As a result, it is possible to delay the time for permitting the execution of the waveform analysis processing. The period of non-execution of the waveform analysis processing from the completion of the preceding waveform analysis processing to the execution of the next waveform analysis processing, that is, the period of execution of the low priority processing, is extended. It is thus possible to perform the engine control properly without being adversely affected because of the non-execution of the low priority processing.

Fifth Embodiment

A fifth embodiment will be described with reference to FIG. 7. In the fifth embodiment, the CPU 6 advances time of completing execution of the waveform analysis processing, when the low priority processing execution is stopped frequently.

Figure 8:
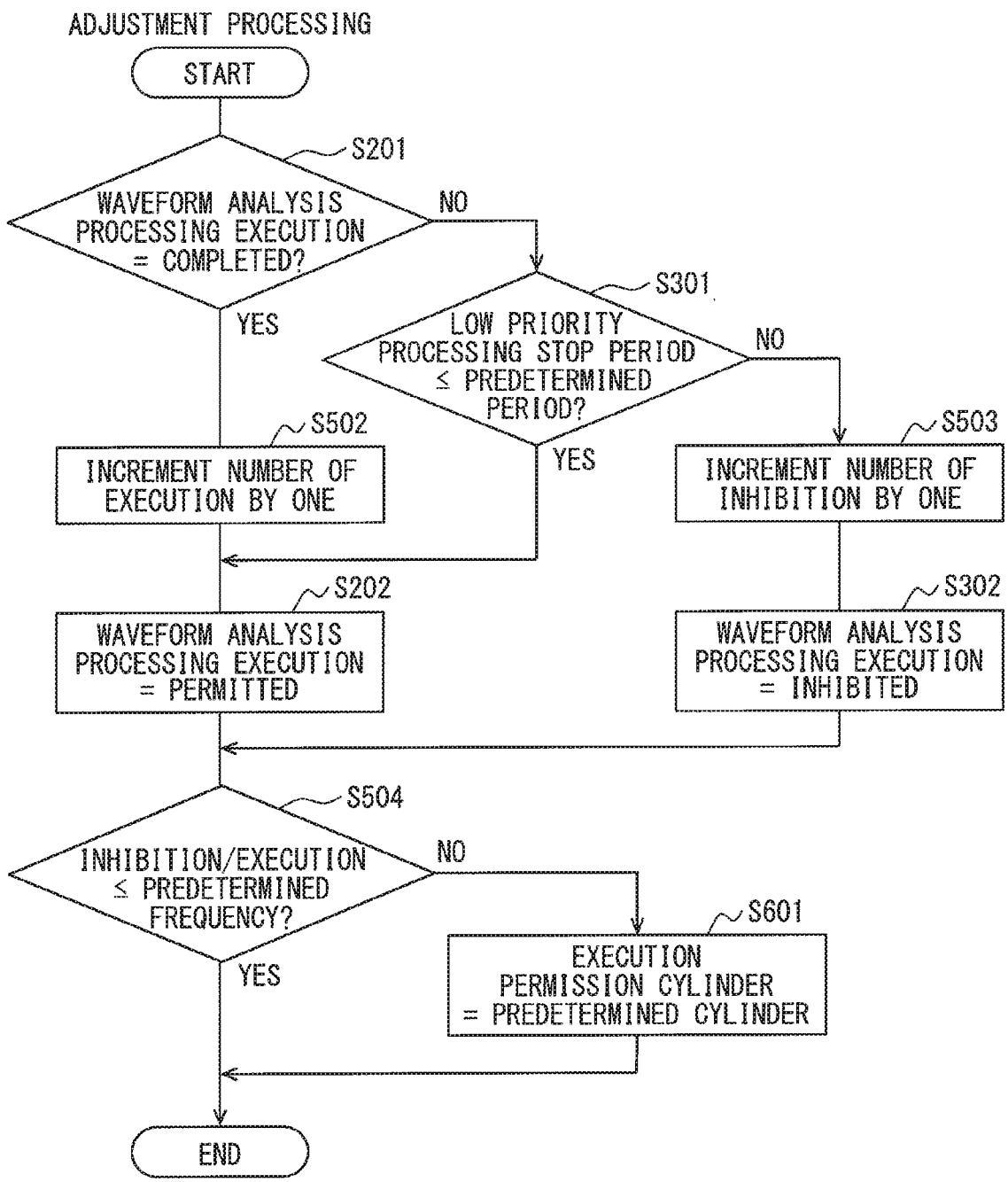
FIG. 8 is a flowchart showing adjustment processing executed in a fifth embodiment.

In the adjustment processing shown in FIG. 8, in case that the inhibition frequency exceeds the predetermined frequency (S504: NO), the CPU 6 sets the execution permission cylinder to be a predetermined cylinder (S601). The predetermined cylinder is a cylinder, the waveform analysis processing for which will be executed later than the waveform analysis processing presently executed for a present cylinder. The predetermined cylinder may be the cylinder, which will be subjected to the waveform analysis processing after the waveform analysis processing of two cylinders from the present cylinder. In case the predetermined cylinder, which is later by two cylinders, exceeds a final cylinder, the predetermined cylinder is set to the cylinder #2, which is the final cylinder. By the operation described above, in case that the inhibition frequency exceeds the predetermined frequency, the CPU 6 executes the waveform analysis processing of the cylinder, in which the combustion occurs later than in the sixth embodiment.

According to the sixth embodiment, since the CPU executes the waveform analysis processing for the cylinder, the firing order of which is later than that of the present cylinder, when the inhibition frequency exceeds the predetermined frequency, it is possible to advance time of completion of the waveform analysis processing. Accordingly, the interval between the completion of the preceding waveform analysis processing and the execution of the next waveform analysis processing, that is, the interval, in which the execution of the low priority processing is enabled, is extended. It is thus possible to perform the engine control properly without being adversely affected because of the non-execution of the low priority processing.

Other Embodiment

Each of the specified periods is not limited to 4 ms but may be set to any other periods. The activation periods of the waveform analysis processing and the adjustment processing are not limited to 1 ms. The activation periods of the waveform analysis processing and the adjustment processing may be set to any periods different from each other.

The activation periods of the waveform analysis processing and the adjustment processing are not limited to the fixed periods but may be set to any periods, at which a predetermined event arises. For example, the activation period may be set to a unit period, in which a crankshaft of the engine 2 rotates a predetermined angular interval.

The analog signal, which is to be AD-converted, may be a sensor signal outputted from a cylinder inner-pressure, which detects an inner pressure of a cylinder of the engine 2. The engine 2 may have less than or more than four cylinders.

The in-vehicle electronic control unit is not limited to the embodiments described above but may be implemented in different configuration.

What is claimed is:

1. An in-vehicle electronic control unit comprising:
an acquisition circuit for acquiring a state data indicating a predetermined state variation of each cylinder of an internal combustion engine at every specified period;
a waveform analysis processor for executing waveform analysis processing, which determines an operation characteristic of the each cylinder of the internal combustion engine, based on the state data of a specified period, in case that an execution of the waveform analysis processing is permitted;
an adjustment processor for permitting the execution of the waveform analysis processing on condition that the waveform analysis processing has been completed; and
a controller for delaying the execution of the waveform analysis processing in case that high priority processing, a priority of which is higher than that of the waveform analysis processing, is under execution at time of an activation of the waveform analysis processing, delaying an activation of low priority processing, a priority of which is lower than that of the waveform analysis processing, in case that the waveform analysis processing is under execution at an activation time of the low priority processing, and for activating the adjustment processor and the waveform analysis processing using a same timing,
wherein
the controller is configured to periodically activate the adjustment processor to perform adjustment processing in successive time periods,
the controller is configured to inhibit the execution of the waveform analysis processing from when the waveform analysis processing has been completed for the specified period to when the adjustment processor is activated in a next time period of the successive time periods after the waveform analysis processing has been completed for the specified period.

2. The in-vehicle electronic control unit according to claim 1, wherein:
the adjustment processor inhibits the execution of the waveform analysis processing in case that the execution of the low priority processing has been stopped for more than a predetermined period.

3. The in-vehicle electronic control unit according to claim 2, wherein:
the waveform analysis processor interrupts the waveform analysis processing, which is under execution, in case that the adjustment processor inhibits the execution of the waveform analysis processing.

4. The in-vehicle electronic control unit according to claim 2, wherein:
the waveform analysis processor executes the waveform analysis processing from the waveform analysis processing for a next cylinder in case that the waveform analysis processor inhibits the execution of the waveform analysis processing.

5. The in-vehicle electronic control unit according to claim 1, wherein:
the waveform analysis processor delays time of permission of the execution of the waveform analysis processing in case that the low priority processing is expected to be adversely affected.

6. The in-vehicle electronic control unit according to claim 1, wherein:
the waveform analysis processor executes the waveform analysis processing on the state data of a cylinder, which follows a next cylinder for the waveform analysis processing, in case that the low priority processing is expected to be adversely affected.

7. An in-vehicle electronic control unit comprising:
an acquisition circuit for acquiring a state data indicating a predetermined state variation of each cylinder of an internal combustion engine at every specified period;
a waveform analysis processor for executing waveform analysis processing, which determines an operation characteristic of the each cylinder of the internal combustion engine, based on the state data of a specified period, in case that an execution of the waveform analysis processing is permitted;
an adjustment processor for permitting the execution of the waveform analysis processing on condition that the waveform analysis processing has been completed; and
a controller for delaying the execution of the waveform analysis processing in case that high priority processing, a priority of which is higher than that of the waveform analysis processing, is under execution at time of an activation of the waveform analysis processing, delaying an activation of low priority processing, a priority of which is lower than that of the waveform analysis processing, in case that the waveform analysis processing is under execution at an activation time of the low priority processing, and for activating the adjustment processor in correspondence to the activation of the waveform analysis processing,
wherein
the waveform analysis processor interrupts the waveform analysis processing, which is under execution, in case that the adjustment processor inhibits the execution of the waveform analysis processing,
the adjustment processor inhibits the execution of the waveform analysis processing in case that the execution of the low priority processing has been stopped for more than a predetermined period,
the waveform analysis processor interrupts the waveform analysis processing, which is under execution, in case that the adjustment processor inhibits the execution of the waveform analysis processing, and
the waveform analysis processor executes the waveform analysis processing from the waveform analysis processing for a next cylinder in case that the waveform analysis processing interrupts the execution of the waveform analysis processing.

8. The in-vehicle electronic control unit according to claim 1, wherein the controller is further configured to:
cause the waveform analysis processor to inhibit the execution of the waveform analysis processing when the waveform analysis processing has been completed for the specified period,
cause the adjustment processor to determine whether the waveform analysis is inhibited upon being activated at a start of the next time period of the successive time periods after the waveform analysis processor inhibited the execution of the waveform analysis processing, and
cause the adjustment processor to permit the waveform analysis processor to execute waveform analysis processing after the adjustment processor determines that the waveform analysis has completed waveform analysis processing.

9. An in-vehicle electronic control unit comprising a computer configured to execute processing of:
acquiring a state data indicating a predetermined state variation of each cylinder of an internal combustion engine at a specified period;
executing waveform analysis processing, which determines an operation characteristic of the each cylinder of the internal combustion engine, based on the state data of a specified period, in case that an execution of the waveform analysis processing is permitted; and
controlling execution of the waveform analysis processing, high priority processing having a priority higher than that of the waveform analysis processing, and a low priority processing having a priority lower than that of the waveform analysis processing, such that the execution of the waveform analysis processing is delayed in case that the high priority processing is under execution at time of an activation of the waveform analysis processing, delaying an activation of the low priority processing in case that the waveform analysis processing is under execution at an activation time of the low priority processing, and activating adjustment processing and the waveform analysis processing at a same period shorter than the specified period,
wherein
the adjustment processing is performed in successive time periods,
the adjustment processing inhibits the execution of the waveform analysis processing in response to a determination of completion of the waveform analysis processing until the adjustment processing is activated in a next time period following the determination of completion of the waveform analysis processing thereby to enable execution of the low priority processing.

10. The in-vehicle electronic control unit according to claim 9, wherein:
the adjustment processing inhibits the execution of the waveform analysis processing in case that the execution of the low priority processing has been stopped for more than a predetermined period.

11. The in-vehicle electronic control unit according to claim 10, wherein:
the waveform analysis processing interrupts a waveform analysis, which is under execution, in case that the adjustment processing inhibits the execution of the waveform analysis.

12. The in-vehicle electronic control unit according to claim 11, wherein:
the waveform analysis processing executes the waveform analysis from the waveform analysis for a next cylinder in case that the waveform analysis processing interrupts the execution of the waveform analysis.

13. The in-vehicle electronic control unit according to claim 10, wherein:
the waveform analysis processing executes a waveform analysis from the waveform analysis processing for a next cylinder in case that the waveform analysis processing inhibits the waveform analysis.

14. The in-vehicle electronic control unit according to claim 9, wherein:
the waveform analysis processing delays time of permission of the execution of the waveform analysis in case that the low priority processing is expected to be adversely affected.

15. The in-vehicle electronic control unit according to claim 9, wherein:
the waveform analysis processing executes a waveform analysis on the state data of a cylinder, which follows a next cylinder for the waveform analysis, in case that the low priority processing is expected to be adversely affected.

16. The in-vehicle electronic control unit according to claim 9, wherein:
the acquiring acquires, as the state data, a fuel pressure injected to each cylinder of the internal combustion engine and detected by a pressure sensor to determine a fuel injection characteristic.

* * * * *